April 5, 1955 S. RUBIN 2,705,778

HIGH-FREQUENCY WAVE-SIGNAL TUNING DEVICE

Filed June 8, 1951

INVENTOR.
SAMUEL RUBIN
BY Lawrence B. Dodds
ATTORNEY

United States Patent Office 2,705,778

Patented Apr. 5, 1955

2,705,778

HIGH-FREQUENCY WAVE-SIGNAL TUNING DEVICE

Samuel Rubin, Long Island City, N. Y., assignor to Hazeltine Research, Inc., Chicago, Ill., a corporation of Illinois

Application June 8, 1951, Serial No. 230,490

4 Claims. (Cl. 333—33)

*General*

Figures 1, 2:
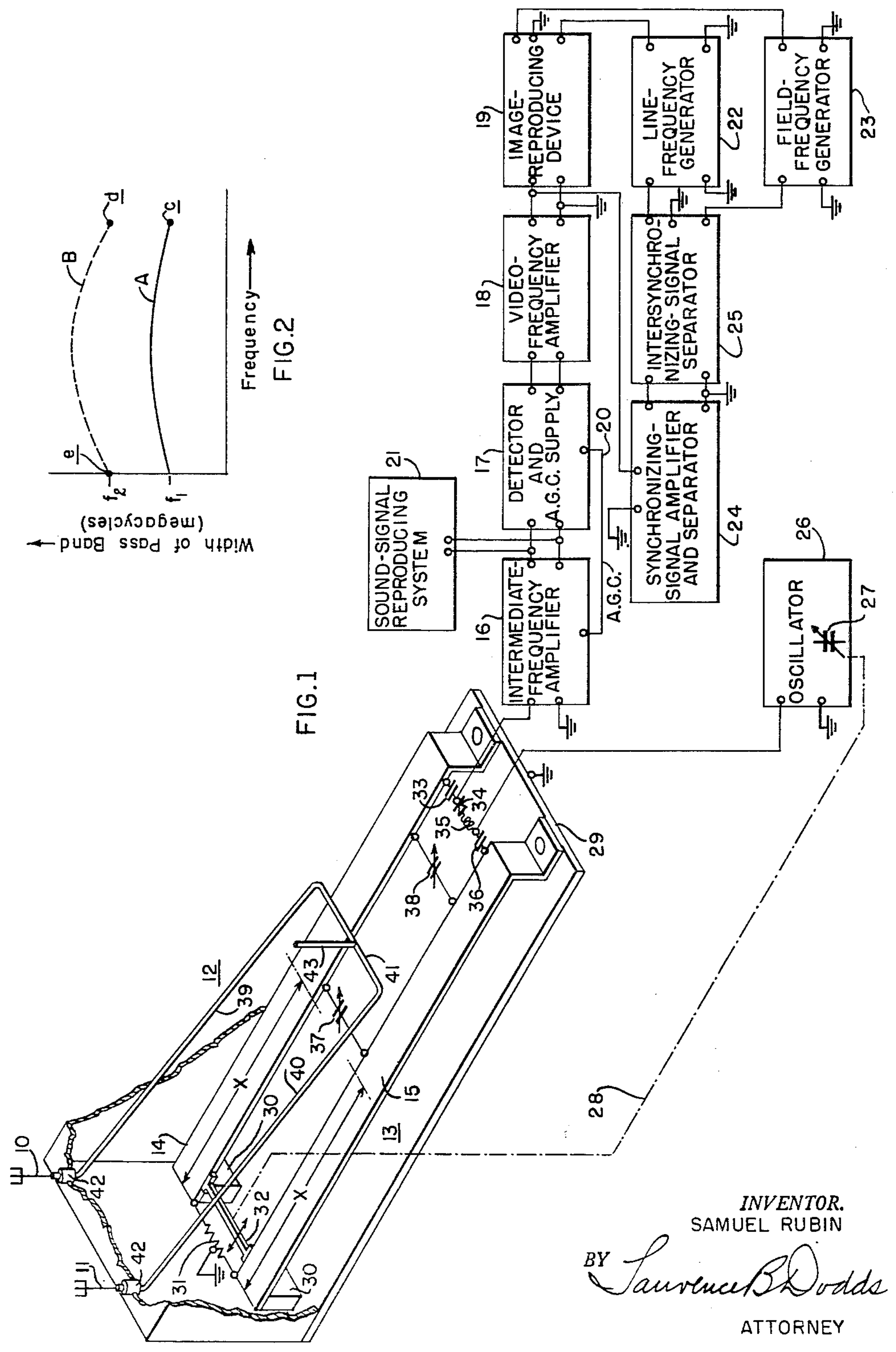

The present invention relates to high-frequency wave-signal tuning devices and, more particularly, to such devices of the transmission-line type in which the effective electrical lengths of the transmission lines thereof are altered to effect tuning over a selected range of frequencies. As used herein, a "transmission line" is meant to include any wave-signal translating device utilizing two conductors for translating wave signals therealong. The invention is especially directed to a tuning device which has at each frequency in the selected frequency range a desired degree of coupling between the transmission line of the device and a coupling member coupled to the transmission line to translate energy, for example, to provide input signal energy for the device. Such a tuning device has particular utility in an ultra-high-frequency television receiver and hence will be described in that environment.

An ultra-high-frequency superheterodyne television receiver usually requires a tuning device tunable over a relatively wide frequency range. To this end the transmission line of the tuning device of such a receiver is ordinarily tuned by means such as a short-circuiting bar displaceable therealong. Wave-signal energy may be coupled into the device from an antenna system by means of a coupling member spaced from and reactively coupled to the tunable transmission line. The wave-signal energy then is usually applied by the transmission line to a suitable load circuit coupled thereto.

It is well known in the art that to provide a maximum power transfer from the antenna system to the load circuit at a selected frequency in the tuning range of the device, the degree of coupling between the coupling member and the transmission line preferably is such that an impedance match is provided between the antenna system and the load circuit at the selected frequency. The degree of coupling between the coupling member and the transmission line which provides an impedance match between the antenna system and the load circuit is ordinarily different at each frequency in the tuning range when the degree of coupling between the load circuit and the transmission line changes as the device is tuned over the tuning range. This is so because the impedances of the load circuit and the antenna system reflected into the transmission line change in accordance with changes in the degree of coupling between the load circuit and the transmission line and the degree of coupling between the antenna system and the transmission line, respectively. For the purpose of minimizing undesirable power losses in the transfer of energy from the antenna system to the load circuit in an ultra-high-frequency superheterodyne television receiver, therefore, the tuning device of the receiver preferably has such a degree of coupling between the coupling member and the transmission line of the device at each frequency in the tuning range thereof that the impedance of the antenna system is substantially matched to the impedance of the load circuit at each frequency in the tuning range. A tuning device having such a degree of coupling between the coupling member and the transmission line of the device at each frequency in the tuning range thereof is referred to herein as having a desired coupling characteristic.

By considering the pass-band-frequency characteristic of the tuning device, it may conveniently be determined whether the device has a desired coupling characteristic and thus provides an impedance match between the antenna system and the load circuit over the tuning range. The width of the pass band of the device usually is a minimum at each frequency in the tuning range thereof when the coupling member is substantially decoupled from the transmission line and generally increases as the degree of coupling between the coupling member and the transmission line increases. It may be shown that an impedance match between the antenna system and the load circuit exists when the degree of coupling between the coupling member and the transmission line is such that the width of the pass band of the tuning device at any frequency in the tuning range is twice the corresponding minimum width at that frequency provided by decoupling the coupling member from the transmission line. Accordingly, a device in which the width of the pass band at each frequency in the tuning range is substantially twice the corresponding minimum width at that frequency has a desired coupling characteristic and thus provides an impedance match between the antenna system and the load circuit.

A prior tuning device is known which utilizes a coupling member having two parallel elongated conductors coupled to a transmission line also having two parallel elongated conductors. The coupling member of this device is positioned in a parallel relation to the transmission line thereof. For some applications the device provides a sufficient impedance match between the source of wave-signal energy and the load circuit coupled to the transmission line. Such a device, however, is not adapted for use in applications where the impedance match required cannot be provided over the tuning range of the device by positioning the coupling member in a parallel relation to the transmission line.

In another prior tuning device of the transmission-line type, a desired coupling characteristic is provided over the tuning range of the device by properly moving the coupling member relative to the transmission line of the device as the tuning means thereof is displaced. Such a device has the limitation of requiring additional moving parts associated with the coupling member which add to the complexity of the construction of the device. Accordingly, such a device has not been entirely suitable for some applications in which it is desirable to utilize a relatively simple and inexpensive tuning device.

It is an object of the present invention, therefore, to provide a new and improved high-frequency wave-signal tuning device which avoids the above-mentioned disadvantages and limitations of prior such devices.

It is another object of the invention to provide an improved high-frequency wave-signal tuning device tunable over a relatively wide frequency range and having a desired coupling characteristic over that range.

In accordance with a particular form of the invention, a high-frequency wave-signal tuning device tunable to each of a plurality of frequencies in a selected range of frequencies for translating energy between an antenna system and a load comprises primary and secondary circuit means for translating energy from the primary circuit means to the secondary circuit means. One of the circuit means comprises only one transmission line and the transmission line has an effective electrical length approximately equal to an integral multiple of one-quarter wave length at a predetermined frequency in the selected range and includes a pair of elongated conductors having distributed reactance. The device includes tuning means slidably displaceable along the conductors for selectively adjusting at each position thereof the effective electrical length of the transmission line to substantially the aforesaid multiple of one-quarter wave length at a frequency in the selected range. The other of the circuit means comprises a fixedly positioned electrical coupling member including a pair of elongated conductors having distributed reactance and extending over the displacement path of the tuning means along the transmission line and coupled to the transmission line by means of distributed reactance over active coupling lengths of both pairs of the conductors determined by the position of the tuning means. The coupling-member conductors are positioned relative to the transmission-line conductors such that the distance between the transmission line and the coupling member varies to provide an impedance match between the antenna system and the load throughout the selected frequency range.

For a better understanding of the present invention, together with other and further objects thereof, reference is had to the following description taken in connection with the accompanying drawing, and its scope will be pointed out in the appended claims.

In the accompanying drawing, Fig. 1 is a schematic representation of a complete television receiver including a high-frequency wave-signal tuning device in accordance with a particular form of the invention; and Fig. 2 is a graph utilized in explaining the operation of the tuning device of the Fig. 1 receiver.

*Description of Fig. 1 receiver*

Referring now more particularly to Fig. 1 of the drawing, the television receiver there represented preferably is adapted to receive wave signals in the ultra-high-frequency band. The receiver comprises an antenna system 10, 11 coupled to a tuning device 13 which includes a coupling member 12 and a tunable transmission line 14, 15. The tuning device 13 is constructed in accordance with the invention and will subsequently be described in greater detail, but it will be noted that the device is coupled to a suitable mixer 34.

The device 13 is coupled in cascade and in the order named to an intermediate-frequency amplifier 16 of one or more stages, a detector and automatic-gain-control or A. G. C. supply 17, a video-frequency amplifier 18 of one or more stages and an image-reproducing device 19 which may comprise a cathode-ray tube. The intermediate-frequency amplifier 16 is tuned to an intermediate frequency of, for example, 40 megacycles. The A. G. C. supply of unit 17 is connected to the input circuits of one or more of the intermediate-frequency amplifier stages by a control-circuit conductor 20. Connected to the output terminals of the intermediate-frequency amplifier 16 is a conventional sound-signal reproducing system 21 which comprises the usual sound intermediate-frequency amplifier, frequency detector, audio-frequency amplifier and loudspeaker.

The output circuit of the video-frequency amplifier 18 is coupled to the input circuit of a line-frequency generator 22 and a field-frequency generator 23 through a synchronizing-signal amplifier and separator 24 and an inter-synchronizing-signal separator 25. The output circuits of the generators 22 and 23 are coupled in a conventional manner to scanning circuits of the image-reproducing device 19.

The television receiver also includes a tunable local oscillator 26 which is coupled to the tuning device 13 and is proportioned to provide therefor a suitable heterodyning signal having a frequency such as 40 megacycles above the resonant frequency of the device 13. The tuner of the oscillator 26 preferably is a transmission-line type of device generally similar to the device 13 and, for convenience, the tuning means of the oscillator is represented diagrammatically as an adjustable condenser 27. The tuning means of the oscillator 26 is mechanically coupled to the tuning means of the device 13, as represented by the dot-dash line 28, to provide unicontrol means for tuning the device 13 and the oscillator 26 over the tuning ranges thereof.

The antenna system 10, 11 and units 16—19 and 21—26, inclusive, may be of conventional construction and operation so that a detailed description and explanation of the operation thereof are unnecessary herein.

*General operation of Fig. 1 receiver*

Considering briefly, however, the general operation of the above-described receiver as a whole, television signals intercepted by the antenna system 10, 11 are selected by the transmission line 14, 15 and are heterodyned in the mixer 34 of the device 13 with the output signal of the local oscillator 26. The television signals are thereby converted to 40-megacycle intermediate-frequency signals. The latter in turn are selectively amplified in the intermediate-frequency amplifier 16 and applied to the detector and automatic-gain-control supply 17. The video-frequency modulation components of the intermediate-frequency signals are derived by the detector of unit 17 and are supplied to the video-frequency amplifier 18, wherein they are amplified and from which they are applied to the input circuit of the image-reproducing device 19. A control voltage derived by the automatic-gain-control supply of the unit 17 is applied as an automatic-amplification-control bias to the gain-control circuits of the intermediate-frequency amplifier 16 to maintain the input signal to the detector of unit 17 within a relatively narrow amplitude range for a wide range of received signal intensities.

The unit 24 selects the synchronizing signals from the other modulation components of the composite television signal applied thereto by the video-frequency amplifier 18. The line-synchronizing and field-synchronizing signals derived by the separator 24 are separated from each other by the unit 25 and are then supplied to individual ones of the generators 22 and 23 to synchronize the operation thereof. Saw-tooth signals are generated in the line-frequency and field-frequency generators 22 and 23 and are applied to the scanning circuits of the image-reproducing device 19, thereby to deflect the cathode-ray beam of the device 19 in two directions normal to each other to trace a rectilinear scanning pattern on the display screen of the device and thus reconstruct the translated picture.

The sound intermediate-frequency signal is amplified in the unit 21 and the audio-frequency modulation components thereof are derived and converted to sound in a conventional manner.

*Description of Fig. 1 tuning device*

Referring now more particularly to the tuning device 13 which embodies the present invention, the device is tunable to each of a plurality of frequencies in a selected range of frequencies and comprises a transmission line which preferably includes a pair of substantially parallel, elongated, flat conductors 14, 15 having distributed reactance. The conductors 14 and 15 are fastened, as by soldering, at one end of each thereof to the base of a suitable metallic housing 29 (shown in a cutaway view) and are supported by a pair of blocks of insulating material 30, 30 at the other ends thereof. The housing 29 provides a low-impedance termination for the pair of conductors 14 and 15 at the aforesaid one end of each thereof and is also effective to shield the transmission line from stray electrical effects. A resistor 31 of suitable value is coupled between the pair of conductors 14 and 15 adjacent the above-mentioned other end of each thereof and is center-tapped to ground to suppress undesirable modes of resonance.

The transmission line 14, 15, including tuning means adjusted to a given position as subsequently described, has an effective electrical length approximately equal to an integral multiple of one-quarter wave length at a predetermined frequency in the selected frequency range. As used throughout the specification and claims, the term "integral multiple" is employed in its usual sense to mean the product of a quantity by an integer including the product obtained by multiplying that quantity by unity. The effective electrical length of the transmission line 14, 15 preferably is approximately equal to one-half wave length at the lowest frequency in the selected frequency range.

The device 13 also includes a tuning means 32 which preferably is displaceable along the conductors 14 and 15 over a portion X of each thereof individually having appreciable lengths relative to a wave length at the above-mentioned predetermined frequency, that is, lengths of the order of one-quarter wave length at the lowest frequency in the selected frequency range. The tuning means 32 is displaceable over the portions X—X of the conductors 14 and 15 for selectively adjusting at each position thereof the effective electrical length of the transmission line 14, 15 to substantially the aforesaid multiple of one-quarter wave length, namely one-half wave length, at a frequency in the selected frequency range. More particularly, the tuning means 32 preferably comprises a metallic strip separated from the flat surfaces of the conductors 14 and 15 by a thin strip of suitable dielectric material (not shown) and displaceable longitudinally of the conductors 14 and 15 to provide a low-impedance termination for the transmission line adjacent the end of the pair of conductors 14 and 15 near the resistor 31.

The tuning device is coupled to an impedance network or load circuit comprising a condenser 33, a crystal mixer 34, an inductor 35 and a condenser 36 connected in a series relation with each other, the terminals of the network being connected to the conductors 14 and 15. The output circuit of the local oscillator 26 is coupled to the junction of the condenser 36 and the inductor 35 for applying a heterodyning signal to the tuning device 13. The input circuit of the intermediate-frequency amplifier 16 is coupled to the junction of the condenser 33 and the crystal mixer 34 for deriving an intermediate-frequency output signal from the device 13. The inductor 35 and the distributed and stray capacitances effectively in parallel therewith (not shown) are so proportioned with relation to the impedance of the crystal mixer 34 and the impedance network is so positioned along the transmission line as substantially to reduce variations in the width of the pass band of the device 13 over the selected frequency range. For example, the inductor 35 may be so proportioned as to resonate with the capacitances associated therewith at a frequency above the tuning range of the device 13. Accordingly, the effective impedance of the inductor then increases with increases in the operating frequency of the device 13, thereby reducing the coupling between the transmission line 14, 15 and the mixer 34 at the higher frequencies in the tuning range. Since the width of the pass band ordinarily increases at the higher frequencies in the tuning range under conditions of constant coupling between the transmission line and the mixer, the reduced coupling therebetween at the higher frequencies reduces variations in the width of the pass band. The proportioning and positioning of the impedance network are disclosed in detail in applicant's copending application Serial No. 167,345, filed June 10, 1950, and entitled "Tuning Device," now abandoned in favor of continuation-in-part application Serial No. 233,455, filed June 25, 1951, and entitled "High-Frequency Wave-Signal Tuning Device."

The tuning device 13 further includes condensers 37 and 38 which have values of impedance so selected as to provide a desired tuning characteristic for the device 13. The condensers 37 and 38 are positioned along and connected to the transmission line 14, 15 intermediate the tuning means 32 and the end of the line terminated by the housing 29. The proportioning and positioning of these condensers are disclosed in detail in the copending application of Charles J. Hirsch and Meyer Press, Serial No. 157,058, filed April 20, 1950, and entitled "High-Frequency Wave-Signal Tuning Device." Briefly, the condenser 37 is positioned near the high-frequency tuning position of the tuning means 32 and serves as a low-frequency trimmer condenser controlling the tuning characteristic of the device 13 primarily in the low-frequency region of the tuning range thereof. The condenser 38 is positioned in the high-frequency resonant portion of the device 13 and serves as a high-frequency trimmer condenser controlling the tuning characteristic of the device 13 primarily in the high-frequency region of the tuning range.

The device 13 also includes the electrical coupling member 12 which preferably includes a pair of substantially parallel elongated conductors 39 and 40 having distributed reactance and which is coupled to the transmission line 14, 15 by means of distributed mutual reactance over lengths of both pairs of the conductors 14, 15 and 39, 40 determined by the position of the tuning means 32. A conductor 41 provides a low-impedance termination for the conductors 39 and 40 at one end thereof. The conductors 39 and 40 are supported by a pair of insulating bushings 42, 42 in the housing 29 and by a suitable insulating rod 43 (a fragmentary portion of which is shown in the drawing) attached at one end thereof to the conductor 41 and at the other end thereof to the top of the housing 29. The antenna system 10, 11 is conductively connected to the conductors 39 and 40 by any suitable means, such as by soldering.

The conductors 39 and 40 preferably individually have lengths approximately equal to the lengths of the portions X—X of the conductors 14 and 15. Specifically, the coupling member 12 ordinarily has a length approximately equal to but slightly greater than one-quarter wave length at the lowest frequency in the selected frequency range. The characteristic impedance of the coupling member 12 preferably is approximately equal to the characteristic impedance of the antenna system 10, 11.

The coupling member conductors 39, 40 are positioned relative to the transmission-line conductors 14, 15 such that the distance between the transmission line and the coupling member varies along the length of the conductors to provide an impedance match between the antenna system and the load throughout the selected frequency range. The conductors 39 and 40 ordinarily are so positioned that the low-impedance termination provided by the conductor 41 is intermediate the tuning means 32 and the end of the pair of conductors 14 and 15, effectively short-circuited by the housing 29. The coupling member 12 also is so positioned that the other or high-impedance end of that member is adjacent the other end of the pair of conductors 14 and 15, namely that end coupled to the resistor 31. When the transmission line 14, 15 is tuned to the highest frequency in the selected frequency range, the active length of the coupling member 12 extending beyond the tuning means 32 toward the end of the pair of conductors 14 and 15 short-circuited by the housing 29 preferably is of the order of one-twentieth wave length at that frequency.

*Adjustment and operation of Fig. 1 tuning device*

More clearly to understand the operation of the tuning device 13, it will be assumed initially that the antenna system 10, 11 is substantially decoupled from the transmission line 14, 15 by positioning the coupling member 12 at a much greater distance from the transmission line than is shown in the drawing. With such antenna coupling, the pass-band-frequency characteristic of the device 13 over the tuning range thereof may be represented by the solid-line curve A of Fig. 2 which represents the width of the pass band of the device 13 at each frequency in the tuning range thereof. The load circuit comprising the condensers 33 and 36, the crystal mixer 34 and the inductor 35 preferably has first been adjusted as previously described. From curve A it will be seen that the pass band of the device has a substantially constant width of $f_1$ megacycles over the tuning range of the device 13.

To provide an impedance match between the antenna system 10, 11 and the load circuit 33—36 over the tuning range of the device 13, the transmission line 14, 15 may be tuned to the highest frequency in the tuning range by positioning the tuning means 32 adjacent the condenser 37 and thus adjusting the effective electrical length of the transmission line to substantially one-half wave length at that frequency. The width of the pass band of the device 13 at the highest frequency in the tuning range thereof is represented by point *c* on curve A of Fig. 2. The coupling member 12 may then be so positioned relative to the transmission line 14, 15 that the conductor 41 is intermediate the tuning means 32 and the end of the transmission line terminated by the housing 29 as shown in the drawing. Thereafter, while a wave signal having substantially the highest frequency in the tuning range of the device 13 is applied thereto by the antenna system 10, 11, the conductor 41 preferably is positioned at such a distance from the transmission line 14, 15 that the width of the pass band of the device 13 doubles, that is, increases from $f_1$ to $f_2$ megacycles as represented by point *d* on the dashed-line curve B of Fig. 2 which represents the pass-band frequency characteristic of the device 13 with the coupling member 12 coupled to the transmission line 14, 15 in accordance with the invention and as represented in Fig. 1. The width of the pass band at each frequency in the tuning range of the device 13 as represented by curve B is substantially twice the corresponding minimum width at that frequency as represented by curve A.

After positioning the conductor 41 of the coupling member 12, the tuning device 13 may then be tuned approximately to the lowest frequency in the tuning range thereof by displacing the tuning means 32 along the transmission line 14, 15 to a position adjacent the resistor 31 as represented in Fig. 1. While a wave signal having substantially the lowest frequency in the selected frequency range is applied to the tuning device 13 by the antenna system 10, 11, the end of the coupling member 12 adjacent the bushings 42, 42 preferably is positioned as shown in Fig. 1 at such a distance from the transmission line 14, 15 that the pass band of the tuning device 13 has a width of substantially $f_2$ megacycles as represented by point *e* on curve B. The width of the pass band of the device 13 then is substantially twice the minimum width of $f_1$ megacycles at the highest and the lowest frequencies in the tuning range of the device. Accordingly, an impedance match between the antenna system 10, 11 and the load circuit 33—36 is provided at these two frequencies and for many applications, a sufficient impedance match will be provided at intermediate frequencies in the tuning range of the device 13 by positioning the ends of the coupling member 12 relative to the transmission line 14, 15 in the manner just explained. If it is desired, however, to provide a better impedance match over the selected range than is obtained by merely positioning the ends of the coupling member, a pliable coupling member may be utilized and several intermediate points thereof may be positioned by following the above-described procedure at intermediate frequencies in the tuning range of the device 13 and by tuning the device first to the higher frequencies and then to the lower frequencies in the tuning range.

After suitable positioning of the ends of the coupling member 12, however, the degree of coupling between that member and the transmission line 14. 15 ordinarily is such that the pass band of the device 13 has at each frequency in the tuning range thereof substantially twice the minimum width at that frequency provided by decoupling the member 12 from the transmission line 14, 15 thus indicating that the device 13 has a desired coupling characteristic over the selected frequency range. The device 13 of the Fig. 1 embodiment has a desired coupling characteristic because the coupling member 12 is obliquely positioned relative to the transmission line 14, 15 and is coupled thereto by means of the distributed capacitive and inductive reactance between lengths of the conductors 14, 15 and 39, 40 which are determined by the position of the tuning means 32. For optimum performance, the distributed capacitive and inductive reactance preferably develops in the transmission line 14, 15 effectively additive signal components. Accordingly, as the device 13 is tuned from the lowest to the highest frequency in the tuning range thereof, the lengths of the coupling member 12 which are effective to couple energy into the transmission line 14, 15 decrease and thereby tend to decrease the degree of coupling between the coupling member 12 and the transmission line at the higher frequencies in the tuning range. At the higher frequencies in the tuning range, however, the low-impedance termination of the transmission line 14, 15 provided by the tuning means 32 is moved to positions nearer the conductor 41 of the coupling member 12 than that position shown in the drawing. Accordingly, the region of the coupling member 12 near the conductor 41 is more effective to couple energy into the transmission line 14, 15 at the higher frequencies than at the lower frequencies in the tuning range because of greater proximity between the conductor 41 and the high-current region of the transmission line 14, 15 at the higher frequency positions of tuning means 32. This effect tends to increase the degree of coupling between the transmission line 14, 15 and the coupling member 12 at the higher frequencies in the tuning range. Thus, a desired coupling characteristic is provided for the device 13 because of the determination of these counteracting effects on the degree of coupling between the transmission line 14, 15 and the coupling member 12 effected by positioning the coupling member 12 in the manner previously explained.

While applicant does not wish to be limited to any particular circuit constants, the following have been employed in a tuning device constructed in accordance with the invention:

| | |
|---|---|
| Condensers 33 and 36 | 30 micromicrofarads. |
| Inductor 35 | .03 microhenry (approx.). |
| Condensers 37 and 38 | 2 micromicrofarads (max.). |
| Crystal mixer 34 | 300 ohms (type G7 General Electric germanium crystal). |
| Resistor 31 | 112 ohms. |
| Characteristic impedance of Transmission line 14, 15. | 125 ohms (approx.). |
| Characteristic impedance of coupling member 12. | 300 ohms (approx.). |
| Tuning range of device 13 | 475–750 megacycles. |
| Width of conductors 14 and 15 | About ⅜ inch. |
| Thickness of conductors 14 and 15 | About ¹⁄₁₆ inch. |
| Distance between conductors 14 and 15 | 1⅛ inches (center-to-center). |
| Distance along transmission line 14, 15 between condenser 38 and the low-impedance termination at housing 29. | About 1 inch. |
| Distance between condensers 37 and 38 | About 2 inches. |
| Travel of tuning means 32 | 3¾ inches. |
| Diameter of conductors 39 and 40 | .094 inch. |
| Length of conductors 39 and 40 | 4.8 inches. |
| Distance between conductors 39 and 40 | About 1.1 inches. |
| Distance between conductor 41 and conductors 14, 15. | .4 inch. |
| Distance along transmission line 14, 15 between conductor 41 and the high-frequency position of tuning means 32. | 1¼ inches. |
| Angle of inclination of coupling member 12 relative to transmission line 14, 15. | About 5 degrees. |

From the foregoing description of the invention it will be apparent that the device 13 embodying the invention has the advantage of being simple in construction and yet having a desired coupling characteristic over the tuning range of the device.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A high-frequency wave-signal tuning device tunable to each of a plurality of frequencies in a selected range of frequencies for translating energy between an antenna system and a load comprising: primary and secondary circuit means for translating energy from said primary circuit means to said secondary circuit means, one of said circuit means comprising only one transmission line and said transmission line having an effective electrical length approximately equal to an integral multiple of one-quarter wave length at a predetermined frequency in said range and including a pair of elongated conductors having distributed reactance; tuning means slidably displaceable along said conductors for selectively adjusting at each position thereof the effective electrical length of said transmission line to substantially said multiple of one-quarter wave length at a frequency in said range; and the other of said circuit means comprising a fixedly positioned electrical coupling member including a pair of elongated conductors having distributed reactance and extending over the displacement path of said tuning means along said transmission line and coupled to said transmission line by means of distributed reactance over active coupling lengths of both pairs of said conductors determined by the position of said tuning means; said coupling-member conductors being positioned relative to said transmission-line conductors such that the distance between said transmission line and said coupling member varies to provide an impedance match between the antenna system and the load throughout said selected frequency range.

2. A high-frequency wave-signal tuning device tunable to each of a plurality of frequencies in a selected range of frequencies for translating energy between an antenna system and a load comprising: primary and secondary circuit means for translating energy from said primary circuit means to said secondary circuit means, one of said circuit means comprising only one transmission line and said transmission line having an effective electrical length approximately equal to one-half wave length at the lowest frequency in said range and including a pair of elongated conductors having distributed reactance and having a low-impedance termination at one end thereof; tuning means slidably displaceable along said conductors for selectively adjusting at each position thereof the effective electrical length of said transmission line to substantially one-half wave length at a frequency in said range; and the other of said circuit means comprising a fixedly positioned electrical coupling member including a pair of elongated conductors having distributed reactance and extending over the displacement path of said tuning means along said transmission line and coupled to said transmission line by means of distributed reactance over active coupling lengths of both pairs of said conductors determined by the position of said tuning means; said coupling-member conductors being positioned relative to said transmission-line conductors such that the distance between said transmission line and said coupling member varies to provide an impedance match between the antenna system and the load throughout said selected frequency range.

3. A high-frequency wave-signal tuning device tunable to each of a plurality of frequencies in a selected range of frequencies for translating energy between an antenna system and a load comprising: primary and secondary circuit means for translating energy from said primary circuit means to said secondary circuit means, one of said circuit means comprising only one transmission line and said transmission line having an effective electrical length approximately equal to an integral multiple of one-quarter wave length at a predetermined frequency in said range and including a pair of substantially parallel elongated conductors having distributed reactance; tuning means slidably displaceable along said conductors for selectively adjusting at each position thereof the effective electrical length of said transmission line to substantially said multiple of one-quarter wave length at a frequency in said range; and the other of said circuit means comprising an electrical coupling member, including a pair of substantially parallel elongated conductors having distributed reactance and extending over the displacement path of said tuning means along said transmission line, said coupling-member conductors being fixedly and obliquely positioned relative to said transmission-line conductors and coupled thereto by means of distributed reactance over active coupling lengths of both pairs of said conductors determined by the position of said tuning means, the oblique positioning of said coupling member being such that the distance between said transmission line and said coupling member varies to provide an impedance match between the antenna system and the load throughout said selected frequency range.

4. A high-frequency wave-signal tuning device tunable to each of a plurality of frequencies in a selected range of frequencies for translating energy between an antenna system and a load comprising: primary and secondary circuit means for translating energy from said primary circuit means to said secondary circuit means, one of said circuit means comprising only one transmission line and said transmission line having an effective electrical length approximately equal to an integral multiple of one-quarter wave length at a predetermined frequency in said range and including a pair of elongated conductors having distributed reactance and having a low-impedance termination at one end thereof; tuning means effective to provide a low-impedance termination for said transmission line adjacent the other end of said pair of conductors and slidably displaceable along said conductors for selectively adjusting at each position thereof the effective electrical length of said transmission line to substantially said multiple of one-quarter wave length at a frequency in said range; and the other of said circuit means comprising an electrical coupling member, including a pair of elongated conductors having distributed reactance and extending over the displacement path of said tuning means along said transmission line and having a low-impedance termination at one end thereof, said coupling-member conductors being so fixedly and obliquely positioned relative to said transmission-line conductors that said last-mentioned termination is intermediate said tuning means and said one end of said first-mentioned pair of conductors and that the other end of said second-mentioned pair of conductors is adjacent said other end of said first-mentioned pair of conductors; said coupling member being coupled to said transmission line by means of distributed reactance over active coupling lengths of both pairs of said conductors determined by the position of said tuning means, the oblique positioning of said coupling member being such that the distance between said transmission line and said coupling member varies to provide an impedance match between the antenna system and the load throughout said selected frequency range.

References Cited in the file of this patent

UNITED STATES PATENTS

| | | |
|---|---|---|
| 2,336,555 | Malling | Dec. 14, 1943 |
| 2,520,614 | Sproull | Aug. 29, 1950 |
| 2,570,650 | Davis | Oct. 9, 1951 |

FOREIGN PATENTS

| | | |
|---|---|---|
| 476,701 | Great Britain | Dec. 4, 1937 |
| 604,652 | Great Britain | July 7, 1948 |

OTHER REFERENCES

"The Radio Amateur's Handbook," The American Radio Relay League, Inc., 1948, pages 463, 464.

"Practical Analysis of Ultra High Frequency," J. R. Meagher and H. J. Markley, 1943, RCA Service Company, Camden, N. J.; page 2 of interest.